US008169035B2

(12) United States Patent
Takada (10) Patent No.: US 8,169,035 B2
(45) Date of Patent: May 1, 2012

(54) SEMICONDUCTOR DEVICE

(75) Inventor: Yoshiharu Takada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 308 days.

(21) Appl. No.: 12/561,882

(22) Filed: Sep. 17, 2009

(65) Prior Publication Data

US 2010/0078732 A1    Apr. 1, 2010

(30) Foreign Application Priority Data

Sep. 29, 2008  (JP) ................................. 2008-249639

(51) Int. Cl.
*H01L 27/06* (2006.01)
(52) U.S. Cl. .......................... 257/379; 257/202; 257/390
(58) Field of Classification Search .................. 257/202, 257/379, 390
See application file for complete search history.

(56) References Cited

U.S. PATENT DOCUMENTS

| 5,345,194 | A * | 9/1994 | Nagasako ........................ 331/99 |
| 6,020,613 | A * | 2/2000 | Udomoto et al. ............. 257/341 |
| 6,346,728 | B1  | 2/2002 | Inoue et al. |
| 6,545,543 | B2 * | 4/2003 | Nelson ........................... 330/307 |
| 7,671,697 | B2 * | 3/2010 | Mun et al. ..................... 333/101 |

FOREIGN PATENT DOCUMENTS

JP            7-111271          4/1995

* cited by examiner

*Primary Examiner* — Jerome Jackson, Jr.
*Assistant Examiner* — David Spalla
(74) *Attorney, Agent, or Firm* — Oblon, Spivak, McClelland, Maier & Neustadt, L.L.P.

(57) ABSTRACT

A semiconductor device, including: a semiconductor substrate; a plurality of unit cells connected in parallel with each other, each unit cell including a plurality of electric field effect transistors formed on the semiconductor substrate; a plurality of gate bus wirings each configured to connect each of the gate electrodes of the transistors constituting the unit cell; a plurality of gate pad electrodes having a multi-layered structure of conductive layers, each of the gate pad electrodes connected to the gate bus wiring; and a resistive element configured to connect adjacent gate pad electrodes and formed along at least one side of an outer peripheral portion of the gate pad electrode, and formed of at least one conductive layer of the conductive layers constituting the gate pad electrode.

13 Claims, 7 Drawing Sheets

SEMICONDUCTOR DEVICE

CROSS-REFERENCE TO RELATED APPLICATION

This application is based upon and claims the benefit of priority from Japanese Patent Application No. 2008-249639 filed on Sep. 29, 2008, the entire contents of which are incorporated herein by reference.

FIELD OF THE INVENTION

The present invention relates to a semiconductor device for obtaining a high output in a high-frequency band operation.

BACKGROUND OF THE INVENTION

In a high output semiconductor device having a lot of units each of which constitutes a field effect transistor having a source electrode, a gate electrode, and a drain electrode and which are alternately connected in parallel with each other in a finger-shape, a device is necessary to ease a phase difference to a high frequency signal between gate electrodes and to prevent an uneven operation. Further, in a high frequency operation, an oscillation occurs when a gain of at least one is obtained in a frequency in which an electric delay time between respective units is set to a half cycle.

As a solving means, a conventional semiconductor device employs a method of using a unit cell, in which a plurality of units as field effect transistors each having a source electrode, a gate electrode, and a drain electrode are connected to each other in a finger-shape as a basic structure, disposing resistive elements between gate bus wirings between adjacent unit cells as to gate bus wirings by which a plurality of the gate electrodes constituting the units are bundled, and electrically connecting adjacent unit cells (JP-A H7-111271 (KOKAI)). With this arrangement, an oscillation can be suppressed by absorbing an uneven high frequency operation between the unit cells by the resistive elements.

Since the gate bus wirings positioned in the vicinity of the electric field effect transistors are affected by the heat generated when a semiconductor device is operated, the resistive elements connected to the gate bus wirings are also affected by the heat when the semiconductor device is operated. Since the resistance value of a conventionally used resistive element using a metal thin film is varied by an operation temperature, the resistive element arises a problem in a stable operation when it is used for a high output device that accompany high heat generation.

In particular, in a high frequency/high output semiconductor device using gallium nitride (GaN) which is expected as a semiconductor material of a next generation, a high frequency/high output operation is required in a high temperature environment due to the excellent physical property of the material. From what has been described above, a more serious problem is caused by heat. In addition to the above problem, in the high frequency/high output semiconductor device which is required to exhibit a high output in a limited chip size, since a space between the bus wirings of a unit cell is limited, the size of a resistive element which can be installed in the space is limited.

SUMMARY OF THE INVENTION

In a semiconductor device of an aspect of the present invention include a semiconductor substrate, a plurality of unit cells connected in parallel with each other, each of the unit cells include a plurality of electric field effect transistors formed on the semiconductor substrate, a plurality of gate bus wiring each configured to connect each of the gate electrodes of the transistors constituting the unit cell, a plurality of gate pad electrodes having multi-layered structure of conductive layers, each of the gate pad electrodes connected to the gate bus wiring, and a resistive element configured to connect the adjacent gate pad electrodes having formed along at least one side of outer peripheral portion of the gate pad electrode, and formed of at least one conductive layer of the conductive layers constituting the gate pad electrode.

DETAILED DESCRIPTION OF THE EMBODIMENTS

A semiconductor device of an embodiment of the present invention will be explained below referring to the drawings.

The semiconductor device of the embodiment is composed of a plurality of unit cells each of which is composed of a plurality of electric field effect transistors formed on a semiconductor substrate and connected in parallel with each other. The semiconductor device has gate pad electrodes having such a structure that they are connected to gate bus wirings for connecting a plurality of gate electrodes of the electric field effect transistors constituting the unit cell to each other and have a plurality of conductive layers stacked thereon. Further, the semiconductor device has resistive elements which connect adjacent gate pad electrodes to each other and are formed of at least one of a plurality of conductive layers constituting the gate pad electrodes along at least one sides of the outer peripheral portions of the gate pad electrodes.

Figure 1:
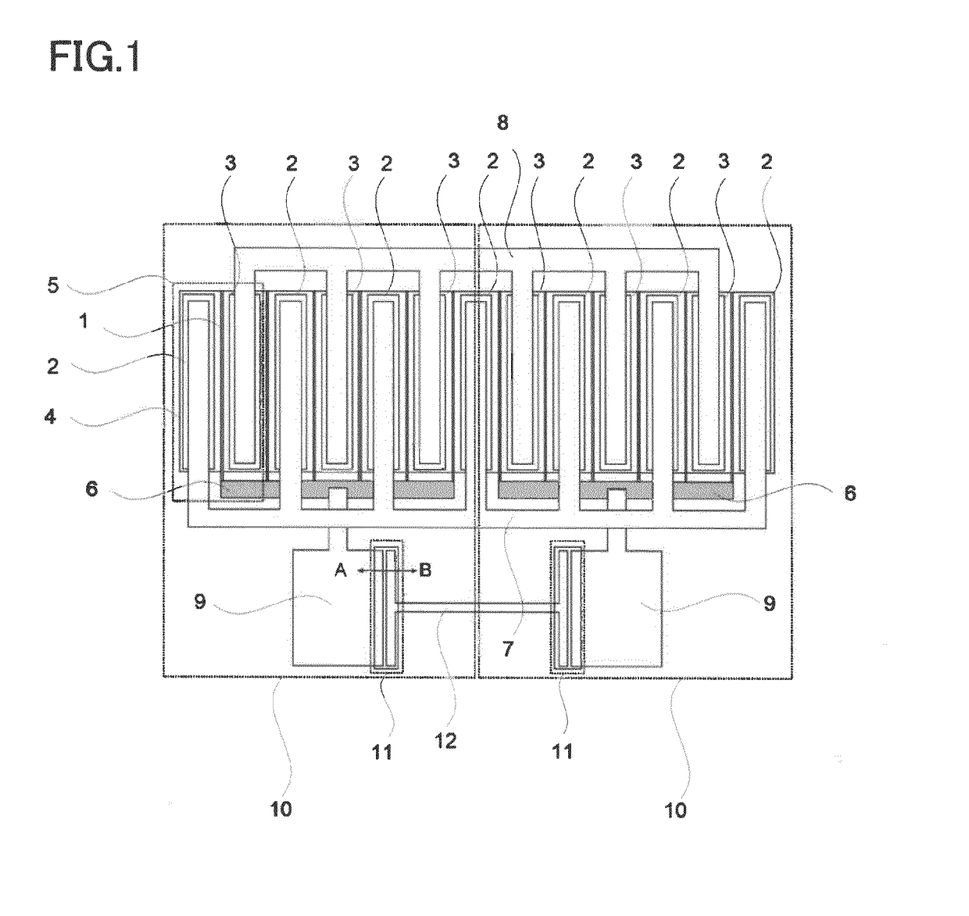
FIG. 1 is a top view of a semiconductor device of an embodiment.
Figure 2:
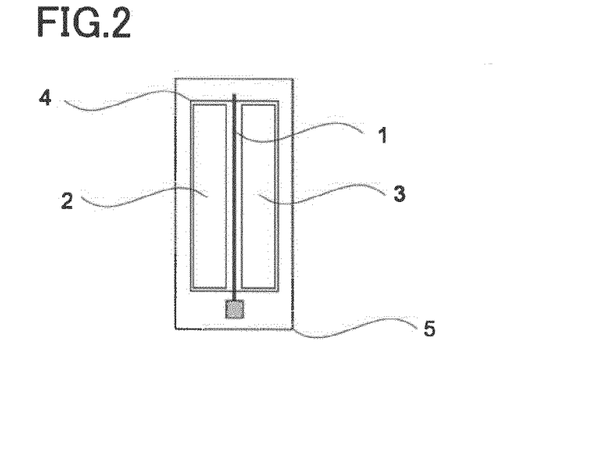
FIG. 2 is a top view of a unit constituting the semiconductor device of the embodiment.

FIG. 1 is a top view of the semiconductor device of the embodiment. FIG. 2 is a top view of a unit constituting the semiconductor device of the embodiment. A unit 5 is composed of electric field effect transistors each having a source electrode 2, a gate electrode 1, and a drain electrode 3 formed in a region surrounded by an element isolation region 4 on a semiconductor substrate. Note that a 3-5 nitride semiconductor substrate, which has, for example, an AlGaN/GaN hetrojunction epitaxial layer grown on a SiC substrate, may be used as the semiconductor substrate.

Figure 3:
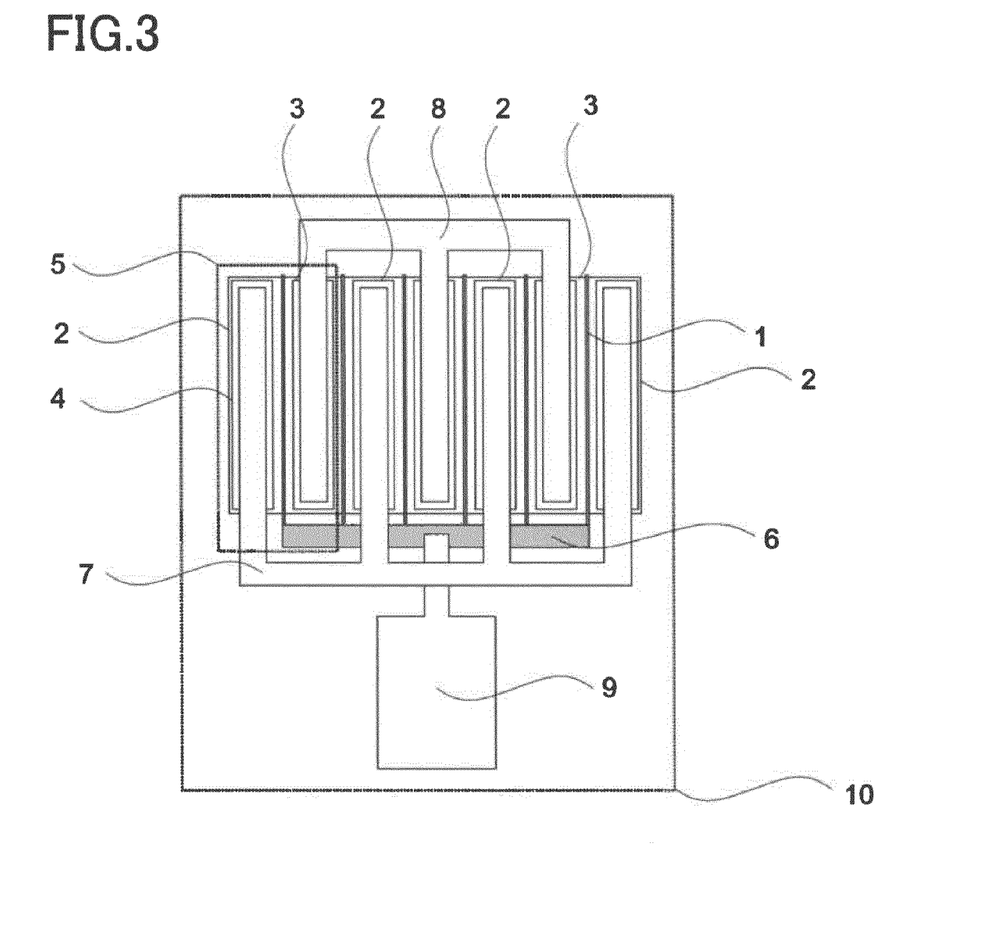
FIG. 3 is a top view of a unit cell constituting the semiconductor device of the embodiment.

FIG. 3 is a top view of a unit cell constituting the semiconductor device of the embodiment. A unit cell 10 has a plurality of the units 5 alternately disposed in parallel thereon. The unit cell 10 has a gate bus wiring 6 for connecting a plurality of the gate electrodes 1 of the respective units 5 to each other. The unit cell 10 has a source bus wiring 7 for connecting a plurality of the source electrodes 2 to each other. Further, the unit cell 10 has a drain bus wiring 8 for connecting a plurality of the drain electrodes 3 to each other. The unit cell 10 is provided with a gate pad electrode 9 connected to the gate bus wiring 6 for the purpose of bonding a wire for signal input.

The gate pad electrode 9 is formed by stacking, for example, a semiconductor substrate and a plurality of conductive layers such as metal films of metal wiring layers. It is advantageous in that defects such as exfoliation in wire bonding can be reduced to form the gate pad electrode 9 by laminating the plurality of conductive layers as described above.

As shown in FIG. 1, the gate pad electrodes 9, which are composed of the same layer structure and disposed adjacent to each other, are connected to the resistive elements 11, which are formed along at least one sides of the outer peripheral portions of the gate pad electrodes 9 through an inter-resistor wiring 12. With this arrangement, the gate electrodes 1 constituting the adjacent units 5 are indirectly and electrically connected. Further, each of the resistive elements 11 is formed of at least one conductive layer of the plurality of conductive layers constituting the gate pad electrodes 9.

Here, an example, in which the resistive element 11 is formed of a sheet resistance component of a semiconductor layer on a semiconductor substrate, will be explained. In AlGaN/GaN-HEMT (aluminum gallium nitride/gallium nitride high-electron-mobility transistor) on a SiC substrate which is known as a high frequency/high output semiconductor device using, for example, a 3-5 nitride semiconductor substrate, the semiconductor substrate has a sheet resistance component of about 500Ω/□.

Figure 4:
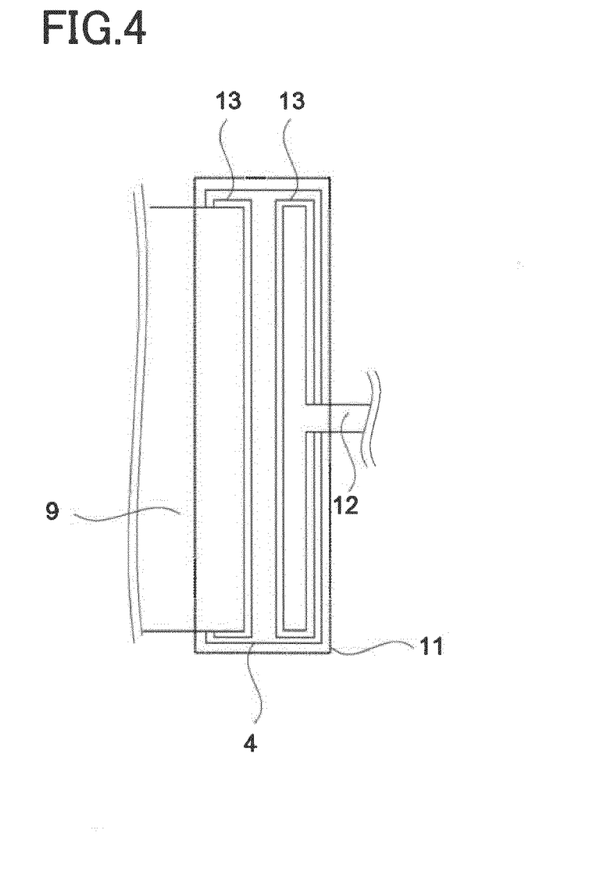
FIG. 4 is a top view of a resistive element portion of the semiconductor device of the embodiment.

When the resistive element 11 has a design value of 10Ω, a resistor of 10Ω is realized in the AlGaN/GaN-HEMT semiconductor substrate by disposing ohmic electrodes having a width of 100 micrometers in confrontation with each other at an interval of 2 micrometers. FIG. 4 is a top view of the resistive element portion. The ohmic electrode 13 has the same structure as those of the source electrode 2 and the drain electrode 3 constituting the unit 5.

Further, the region, in which the resistive element 11 is formed, is electrically isolated from the periphery thereof by the same structure as that for electrically insulating the active region on the semiconductor substrate, which is composed of the unit 5 composed of the electric field effect transistor having the source electrode 2, the gate electrode 1, and the drain electrode 3, from the periphery thereof.

Figure 5:
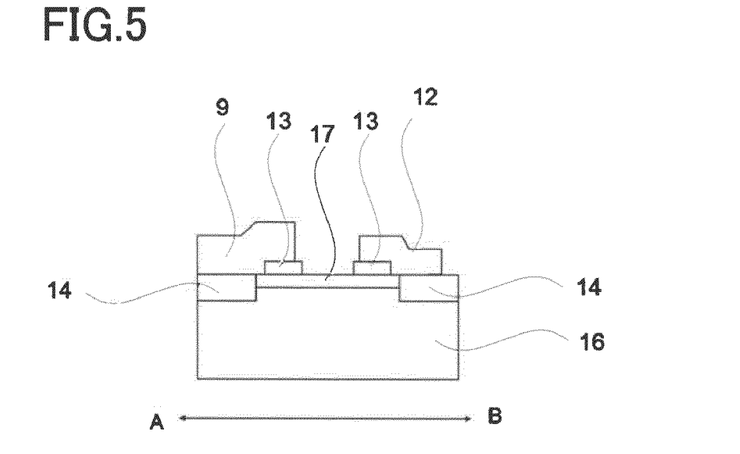
FIG. 5 is a sectional view taken along a line A-B of FIG. 1.
Figure 6:
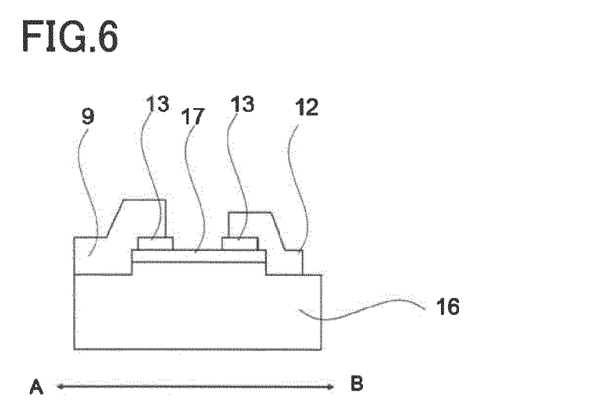
FIG. 6 is a sectional view taken along the line A-B of FIG. 1.

FIGS. 5 and 6 are sectional views taken along a line A-B of FIG. 1. As shown in the figures, the sheet resistance component of an AlGaN layer 17 on a GaN layer 16 (an AlGaN/GaN hetrojunction epitaxial later) is used by the resistive element 11. FIG. 5 shows a resistive element to which an element isolation region 14 formed by ion implantation is applied. According to the structure, a step of a foundation is reduced when the wiring layers are formed, which is preferable for miniaturization of a device. Further, FIG. 6 shows a resistive element in which a device separation method using mesa isolation is applied to a mesa etching process. This structure is advantageous in that a manufacturing process can be made in a low cost.

Further, the inter-resistor wiring 12 for connecting the resistive elements 11 formed in the adjacent gate pad electrodes 9 uses the metal layer of at least a part of the metal stacked layers constituting the gate pad electrodes 9. Accordingly, it is not necessary to add a new step to newly form the resistive elements 11. Further, the resistive elements 11 are formed along at least one sides of the peripheral shapes of the gate pad electrodes 9 to reduce an area penalty caused by disposing the resistive elements 11 as well as to keep a distance from a device from which heat is generated.

When the resistive elements 11 are disposed along the gate pad electrodes 9 away from the active region acting as a heat source in operation, it is possible to effectively prevent the adverse affect of heat particularly in a high temperature operation. In general, the gate pad electrodes 9 are disposed farther from the active region acting as the heat source than drain pad electrodes 19. Therefore, the structure, in which the resistive elements 11 are disposed along the gate pad electrodes 9, can more effectively prevent the adverse affect of heat than the structure in which the resistive elements are disposed in the drain pad electrodes 19. The former structure is effective to improve the reliability of the resistive elements 11 with the result that the structure contributes to increase in the performance of the semiconductor device.

Note that although the resistive elements 11 are preferably formed along the one sides on the gate pad electrode sides adjacent to the gate pad electrodes 9 as shown in FIG. 1 from the viewpoint of avoiding the adverse affect in the wire bonding, the resistive elements 11 are not necessarily formed along the one sides and may be formed along other sides.

Figure 7:
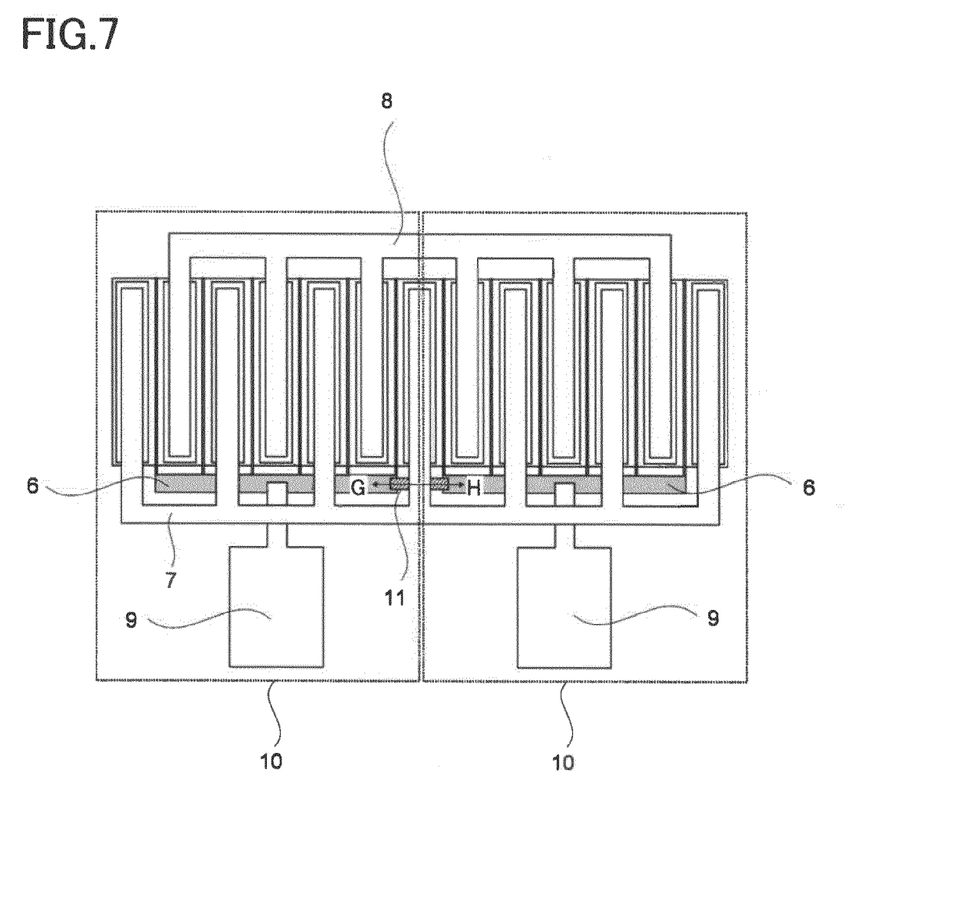
FIG. 7 is a top view of a semiconductor device of a conventional technique.

Next, a conventional technique will be simply explained using figures to clarify the operation/working effect of the embodiment. FIG. 7 is a top view of a semiconductor device of the conventional technique. In the semiconductor device, a resistive element 11 is interposed between gate bus wirings 6 of adjacent unit cells. However, since the distance between the gate bus wirings 6 is designed narrow to increase an element density, a resistive element using the substrate resistance component described above cannot be disposed therebetween due to its size.

Figure 8:
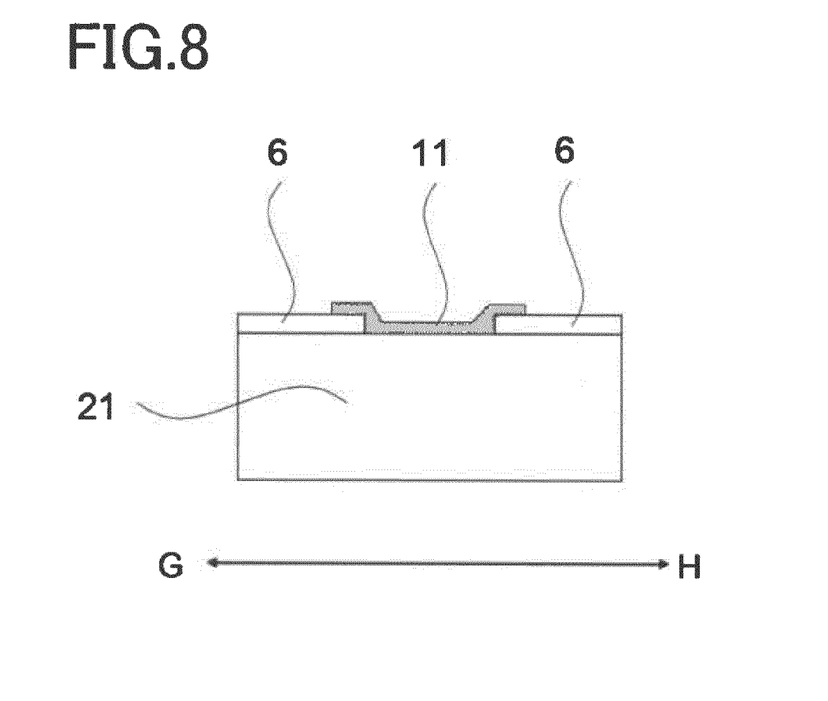
FIG. 8 is a sectional view taken along a line G-H of FIG. 7.
Figure 9:
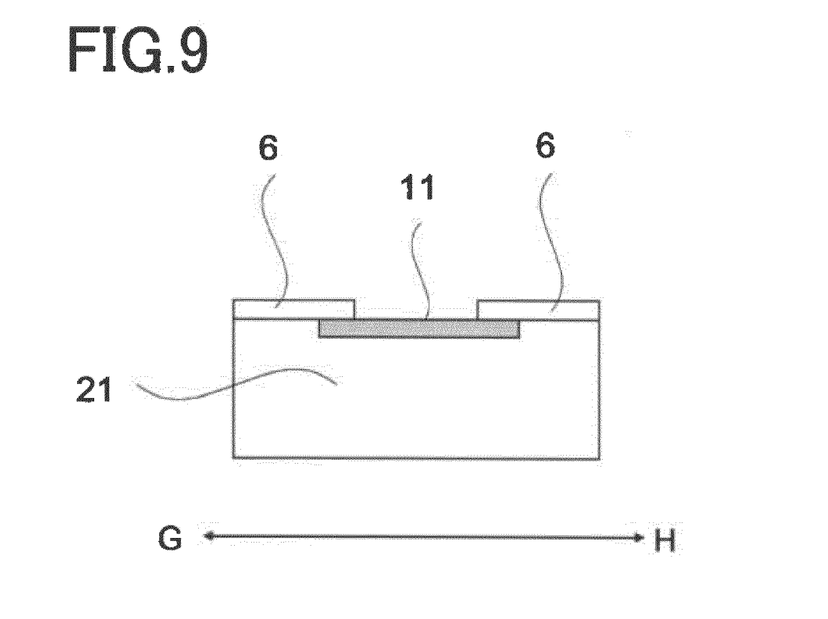
FIG. 9 is a sectional view taken along the line G-H of FIG. 7.

FIGS. 8 and 9 are sectional views taken along a line G-H of FIG. 7. More specifically, FIGS. 8 and 9 are sectional views of a resistive element portion of the semiconductor device of the conventional technique. A high frequency/high output semiconductor device using GaAs (gallium arsenide) as a material uses a metal thin film having a structure shown in FIG. 8 as the resistive element 11 in many cases. However, in a semiconductor device using GaN (gallium nitride) for which a high output operation is required in a high temperature environment, it applies an adverse affect on the characteristics of the semiconductor device to dispose a metal thin film resistor, which is liable to be adversely affected by heat, in the gate bus wiring 6 adjacent to an active region composed of a unit acting as a heat source.

Further, as another method of forming the resistive element 11, there is a method of forming an active region having a low resistance by ion-implanting silicon highly densely as shown in FIG. 9 and causing the active region to function as the resistive element 11. However, the GaN (gallium nitride) material requires a high temperature heat treatment executed at a temperature exceeding 1000° C. to be activated. Further, semiconductor characteristics are adversely affected by the high temperature heat treatment. From what has been described above, it is difficult to realize a structure as shown in FIG. 9.

Figure 10:
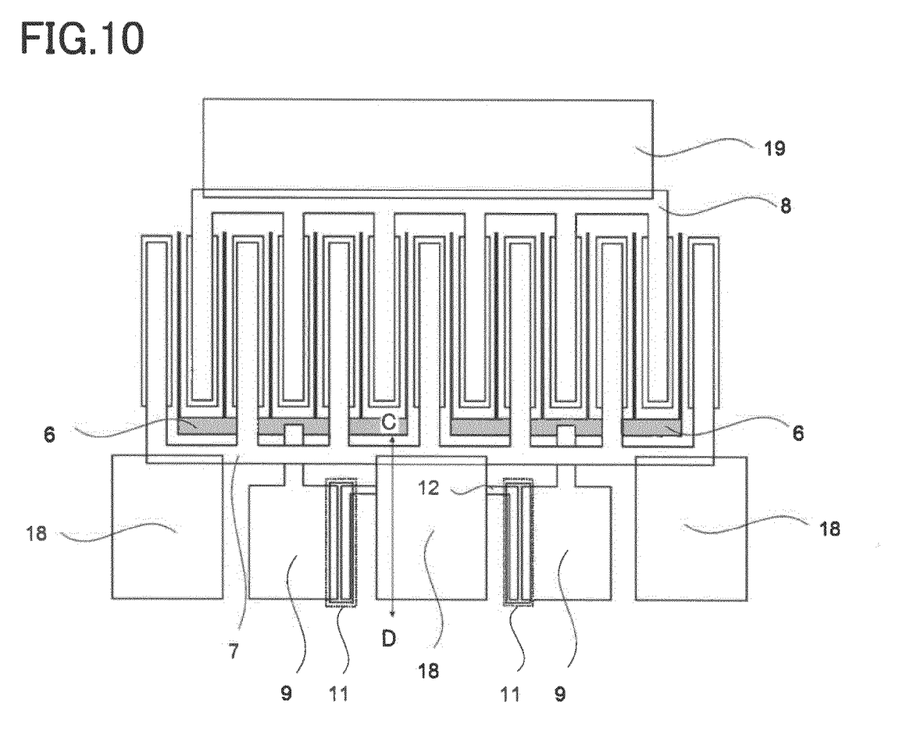
FIG. 10 is a top view of a semiconductor device of a first modification of the embodiment.
Figure 11:
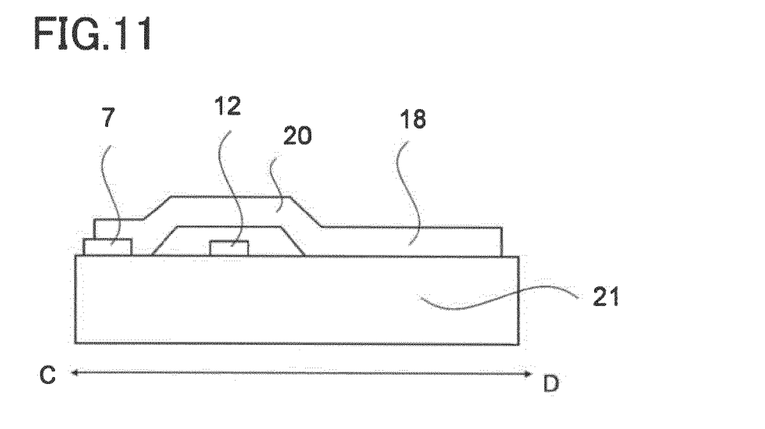
FIG. 11 is a sectional view taken along a line C-D of FIG. 10.

Next, a semiconductor device of a first modification of the embodiment will be explained. FIG. 10 is a top view of the semiconductor device of the first modification. FIG. 11 is a sectional view taken along a line C-D of FIG. 10. More specifically, FIG. 11 is a sectional view of a source pad electrode portion of the first modification. When a source pad electrode 18 for wire bonding, which is connected to a source bus wiring 7 through a wiring 20, exists between adjacent gate pad electrodes 9 as shown in FIG. 10, an inter-resistor wiring 12 for connecting resistive elements 11 added to the adjacent gate pad electrodes 9 described above can be disposed by arranging the wiring 20 for connecting the source pad electrode 18 to the source bus wiring 7 as a hollow wiring having an air bridge structure as shown in FIG. 11.

Figure 12:
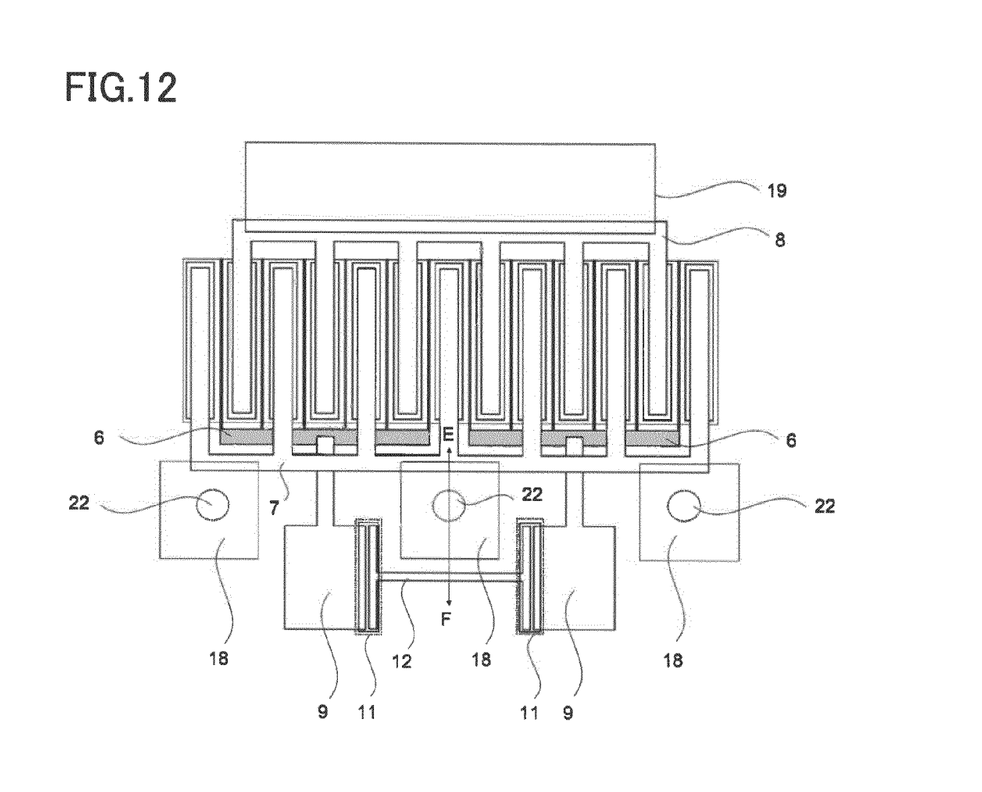
FIG. 12 is a top view of a semiconductor device of a second modification of the embodiment.
Figure 13:
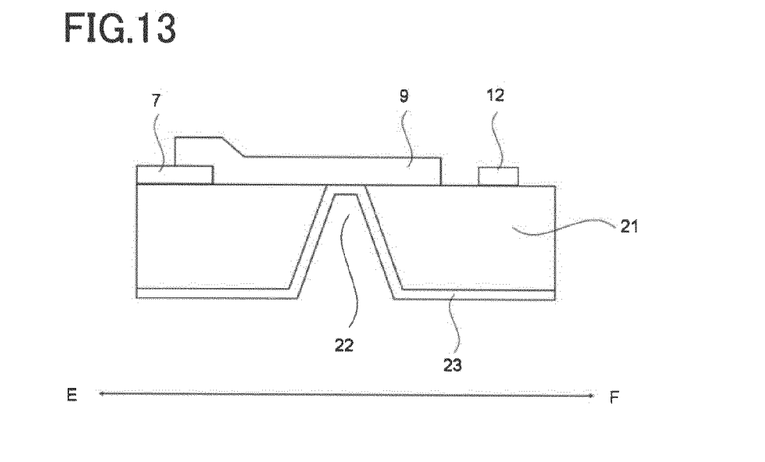
FIG. 13 is a sectional view taken along a line E-F of FIG. 12.

Next, a semiconductor device of a second modification of the embodiment will be explained. FIG. 12 is a top view of the semiconductor device of the second modification. FIG. 13 is a sectional view taken along an E-F line of FIG. 12. More specifically, FIG. 13 shows a sectional view of a source pad electrode portion. This is a case in which a source pad electrode for a via hole exists between adjacent gate pad electrodes 9 and is connected to a source bus wiring 7 through a wiring as well as connected to a back surface electrode 23 through a via hole 22. The same operation/working effect as that of the embodiment can be also obtained by the second modification.

As described above, in the embodiment and the modifications thereof, since the gate electrode which constitutes the unit cell connected to the adjacent bonding electrodes is connected through the resistive elements which are not adversely affected even in the high temperature operation, the resistive elements can reduce the overall gain of a loop generated between adjacent unit cells. Accordingly, occurrence of an oscillation can be suppressed by absorbing the uneven operation of high frequency characteristics by the resistive elements. As a result, the present invention is effective to increase the performance of the high frequency/high output semiconductor device.

The embodiment of the present invention has been explained above referring to the specific examples. However, the above embodiment is only an example and does not restrict the present invention. Further, in the explanation of the embodiment, although the description of portions of the semiconductor device which are not directly necessary for the explanation of the present invention is omitted, the elements which are necessary for the semiconductor device and the like can be appropriately selected and used.

Although the AlGaN/GaN-HEMT has been mainly explained in the embodiment, the present invention is not limited thereto, and relates to the overall high frequency semiconductor device.

Further, in the embodiment, the case, in which the sheet resistance of the semiconductor substrate is used as the resistive elements, has been explained as an example. Although the sheet resistance of the semiconductor substrate is preferably used from the viewpoint of heat resistance, it is also possible to use a metal layer used for a metal wiring as the resistive elements. A W (tungsten) material, a Ta (tantalum) material, a Ti (titanium) material, a Cr (chromium) material, and the like, for example, can be also applied.

In addition to the above arrangements, all the semiconductor devices which have the elements of the present invention and can be appropriately designed and modified by persons skilled in the art are included in the scope of the present invention. The scope of the present invention is defined by the scope of claims and their equivalents.

What is claimed is:

1. A semiconductor device, comprising:
   a semiconductor substrate;
   a plurality of unit cells connected in parallel with each other, each unit cell includes a plurality of electric field effect transistors formed on the semiconductor substrate;
   a plurality of gate bus wirings each configured to connect each of gate electrodes of the transistors;
   a plurality of gate pad electrodes having a multi-layered structure of conductive layers, each gate pad electrode connected to the gate bus wiring; and
   a resistive element configured to connect adjacent gate pad electrodes, the adjacent gate pads constituting parts of adjacent unit cells, respectively, the resistive element being formed along at least one side of outer peripheral portions of the gate pad electrodes, and formed of at least one conductive layer of the conductive layers.

2. The device according to claim 1, wherein the at least one of the conductive layers forming the resistive element is the semiconductor substrate.

3. The device according to claim 1, wherein the resistive element is formed on the adjacent gate pad electrode side.

4. The device according to claim 2, wherein the resistive element is formed on the adjacent gate pad electrode side.

5. The device according to claim 1, wherein the semiconductor substrate is a 3-5 nitride semiconductor substrate.

6. The device according to claim 2, wherein the semiconductor substrate is a 3-5 nitride semiconductor substrate.

7. The device according to claim 3, wherein the semiconductor substrate is a 3-5 nitride semiconductor substrate.

8. The device according to claim 4, wherein the semiconductor substrate is a 3-5 nitride semiconductor substrate.

9. The device according to claim 2, wherein the resistive element is formed in a region on the semiconductor substrate insulated from other elements by ion implantation and is formed between ohmic electrodes confronting with each other.

10. The device according to claim 8, wherein the resistive element is formed in a region on the semiconductor substrate insulated from other elements by ion implantation and is formed between ohmic electrodes confronting with each other.

11. The device according to claim 2, wherein the resistive element is formed in a region on the semiconductor substrate insulated from other elements by mesa isolation and is formed between ohmic electrodes confronting with each other.

12. The device according to claim 8, wherein the resistive element is formed in a region on the semiconductor substrate insulated from other elements by mesa isolation and is formed between ohmic electrodes confronting with each other.

13. The device according to claim 2, further comprising:
   an ohmic electrode formed between each of the gate pads and the resistive element;
   a source electrode; and
   a drain electrode;
   wherein the ohmic electrode has a same structure as the source electrode and the drain electrode.

* * * * *